United States Patent [19]

Kotecha et al.

[11] 4,380,057
[45] Apr. 12, 1983

[54] ELECTRICALLY ALTERABLE DOUBLE DENSE MEMORY

[75] Inventors: Harish N. Kotecha, Essex Junction; Wendell P. Noble, Jr., Milton; Francis W. Wiedman, III, Stowe, all of Vt.

[73] Assignee: International Business Machines Corporation, Armonk, N.Y.

[21] Appl. No.: 200,851

[22] Filed: Oct. 27, 1980

[51] Int. Cl.$^3$ .............................................. G11C 11/40
[52] U.S. Cl. ...................................... 365/185; 357/23
[58] Field of Search ....................... 365/184, 185, 182; 357/23 VT

[56] References Cited

U.S. PATENT DOCUMENTS

| | | | |
|---|---|---|---|
| 3,728,695 | 4/1973 | Bentchkowsky | 365/184 |
| 3,914,855 | 10/1974 | Cheney et al. | 29/571 |
| 4,112,507 | 9/1978 | White et al. | 357/23 VT |
| 4,161,039 | 7/1979 | Rössler | 365/185 |
| 4,217,601 | 8/1980 | Dekeersmaecker et al. | 357/23 VT |
| 4,305,083 | 12/1981 | Gutierrez | 357/23 VT |
| 4,334,292 | 6/1982 | Kotecha | 365/182 |
| 4,355,375 | 10/1982 | Arakana | 365/185 |

OTHER PUBLICATIONS

*Electronics*, Feb. 15, 1971, pp. 99-104, T. P. Cauge et al., "Double-Diffused MOS Transistor Achieves Microwave Gain".

*Journal of Applied Physics*, 51(5), May 1980, pp. 2722-2735 by D. J. DiMaria et al., "High Current Injection into SiO$_2$ from Si Rich SiO$_2$ films . . . ".

IEEE Electron Device Letters, vol. EDL-1, No. 9, Sep. 1980 by D. J. DiMaria et al., "Electrically-Alterable Memory Using a Dual Electron . . . ".

*Primary Examiner*—Stuart N. Hecker
*Attorney, Agent, or Firm*—Stephen J. Limanek

[57] ABSTRACT

An electrically alterable double dense memory is provided which includes a field effect transistor having first and second spaced apart diffusion regions of a first conductivity defining a channel region at the surface of a semiconductor substrate having a second conductivity. First and second floating gates are disposed over the first and second diffusion regions, respectively, and each extends over an end of the channel region. First and second dual charge injector structures or enhanced conduction insulators are disposed between the first and second floating gates and a common control gate of the transistor. A word line is connected to the control gate and first and second bit lines are connected to the first and second diffusion regions. By applying appropriate pulses to the word and bit lines, a selected floating gate can be charged to alter the conductivity of the end of the channel region associated with the selected floating gate and then discharged at will. In this manner binary digits of information are stored in each of the two floating gates and altered as desired. By applying appropriate voltages to the control gate and to one of the first and second diffusion regions, the stored information or charge condition of the floating gate associated with the other of the first and second diffusion regions can be determined.

15 Claims, 5 Drawing Figures

ELECTRICALLY ALTERABLE DOUBLE DENSE MEMORY

DESCRIPTION

1. Technical Field

This invention relates to integrated semiconductor circuits and more particularly to a storage system or transistor array which may be used, e.g., in eletrically alterable read only memories.

2. Background Art

Integrated semiconductor circuits, particularly systems or arrays having transistors each of which represents a binary digit of information, as in read only memories (ROM), have achieved high device or cell densities.

In, e.g., U. S. Pat. No. 3,914,855, filed May 9, 1974, there is described a read only memory wherein the array has transistors made with a thin gate dielectric exhibiting a low threshold voltage for storing one digit of binary information and transistors made of a thick gate dielectric exhibiting a considerably higher threshold voltage for storing the other digit of binary information. This patent also describes a read only memory wherein the array is encoded by etching apertures in the gate electrodes of selected devices and implanting ion impurities through the apertures to render the selected devices inoperative, thus defining one digit of binary information, while the remaining devices which do not have apertures in the gate electrode are operative devices or transistors defining the other digit of binary information. The read only memories employing the thick and the thin gate dielectrics have a high cell density but the personalization of the memory cells must be made during the early steps of the process, whereas the read only memories having apertures in the gate electrodes require a relatively wide gate electrode or word line and, therefore, sacrifice density.

In U. S. Pat. No. 4,161,039, filed Feb. 6, 1978, there is disclosed a memory array utilizing field effect transistors wherein information is stored in floating gates and the channel region is made short by employing double-diffusion processing techniques, as disclosed in more detail in *Electronics*, Feb. 15, 1971, at pages 99–104. This memory is not a simple read only memory but it can be reprogrammed by erasing the stored information with ultraviolet light.

Commonly assigned U.S. patent application having Ser. No. 126,636, filed Mar. 3, 1980, by W. D. Pricer and J. E. Selleck, describes and claims a storage system which includes field effect transistors each having two spaced apart diffusions with at least one of the two diffusions of some of the transistors having a high threshold. Means are provided for applying to one high threshold diffusion a voltage having a polarity and magnitude sufficient to neutralize the high threshold of the one diffusion. The system also includes means for determining current flow between the two spaced apart diffusions when the one diffusion has its high threshold neutralized. With the neutralizing voltage applied to the one diffusion of the two diffusions, the one diffusion acts as the drain of the transistor with the other diffusion of the two diffusions acting as the source of the transistor. Thus, if the other or source diffusion also has a high threshold, then little or no current flows between the two spaced apart diffusions when a gate voltage of, say, 5 to 10 volts is applied to the gate electrode of the transistor, which current value indicates the presence of, e.g., a "1" digit of binary information being stored at the other diffusion of the two diffusions. However, if the other or source diffusion has a low threshold, then a relatively high current flows between the two spaced apart diffusions when the gate voltage is applied to the gate electrode of the transistor, which current value indicates the presence of, e.g., a "0" digit of binary information being stored at the other diffusion of the two diffusions. With the neutralizing voltage applied to the other diffusion of the two diffusions, the other diffusion now acts as the drain of the transistor with the one diffusion now acting as the source of the transistor. Accordingly, with this arrangement the presence of a "1" digit or a "0" digit of information stored at the one diffusion can also be detected. Of course, if the neutralizing voltage is not required to neutralize a high threshold diffusion, then this voltage will be used simply as the drain voltage tending to pass current between the two spaced apart diffusions dependent upon the existence or non-existence of a high threshold diffusion at the source of the transistor.

In another commonly assigned U.S. patent application having Ser. No. 153,359, filed May 27, 1980, by H. N. Kotecha, there is described and claimed a system for charging and discharging a conductive plate with a charge injector controlled by a low single polarity voltage pulse which is particularly suitable for electrically alterable read only memories. In an embodiment of that system, the conductive plate is a floating gate of a field effect transistor which also includes first and second or dual control gates. A single or double graded band gap layer, such as a silicon-rich layer of silicon dioxide is disposed only between the floating gate and the first control gate forming a capacitor having a given capacitance with a larger capacitor disposed between the second control gate and the floating gate. These cells or transistors may be used in an array for storing for long periods of time, on the order of 10 years or more, binary digits of information representing a 0 or a 1 depending upon whether a charge is stored on the floating gate. When using these cells in a memory array, information may be written into or erased from each of the cells individually or a blanket erase may be employed for the entire or a selected section of the array. To write and to erase a cell, a low single polarity voltage is employed.

In a further commonly assigned U.S. patent application having Ser. No. 192, 579 filed Sept. 30, 1980, by C. L. Bertin, H. N. Kotecha and F. W. Wiedman, there is disclosed and claimed non-volatile semiconductor memories which include a volatile circuit coupled to a non-volatile device having a floating gate and first and second control gates capacitively coupled to the floating gate with a dual charge or electron injector structure or enhanced conduction insulator disposed between the floating gate and one of the two control gates. The volatile circuit may be a dynamic one device cell or a static cell such as a conventional flip-flop or latch cell. A detailed discussion of enhanced conduction insulators may be found in an article entitled "High Current Injection Into $SiO_2$ from Si rich $SiO_2$ Films and Experimental Applications" by D. J. DiMaria and D. W. Dong, Journal of Applied Physics 51(5), May 1980, pp. 2722–2735 and a basic memory cell which utilizes the dual electron injector structure is taught in an article entitled "Electrically-Alterable Memory Using A Duel Electron Injector Structure" by D. J. DiMaria, K. M. DeMeyer and D. W. Dong, IEEE Electron Device Letters, Vol EDL-1, No. 9, September 1980, pp. 179-181.

DISCLOSURE OF THE INVENTION

It is an object of this invention to provide an improved transistor memory array which has a high density of transistors with predetermined threshold voltages.

It is another object of this invention to provide an improved high density memory transistor array which is electrically alterable.

It is still another object of this invention to provide an improved electrically alterable read only memory transistor array having a high density of transistors with predetermined threshold voltages which may be programmed and erased rapidly with low voltages.

It is yet another object of this invention to provide an improved elecrically alterable read only memory which has a high density of field effect transistors wherein each of the transistors has two predetermined threshold voltages and wherein the memory is programmed or erased rapidly with low voltages.

It is a further object of this invention to provide an improved electrically alterable read only memory which has a high density of field effect transistors wherein each of the transistors may have two of several predetermined threshold voltages.

It is yet a further object of this invention to provide an improved electrically alterable read only memory system having a plurality of field effect transistors wherein each transistor is programmed to simultaneously store two binary digits of information.

In accordance with the teachings of this invention, an electrically alterable double dense memory is provided which includes a metal-oxide-semiconductor device or field effect transistor having first and second spaced apart diffusion regions of a first conductivity defining a channel region at the surface of a semiconductor substrate having a second conductivity of a given magnitude. First and second floating gates are disposed over the first and second diffusion regions, respectively, and each extends over an end of the channel region. First and second dual charge injector structures or enhanced conduction insulators are disposed between the first and second floating gates and a common control gate. A word line is connected to the control gate and first and second bit lines are connected to the first and second diffusion regions. By appropriately charging a selected floating gate the conductivity of the end of the channel associated with the selected floating gate is varied to store a given digit of binary information at the selected floating gate. In a similar manner the conductivity of the other end of the channel may be altered by charging the other of the first and second floating gates. By applying appropriate voltages to the control gate and to one of the first and second diffusion regions, the stored information or conductivity state of the end of the channel at the other of the first and second diffusion regions can be determined.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
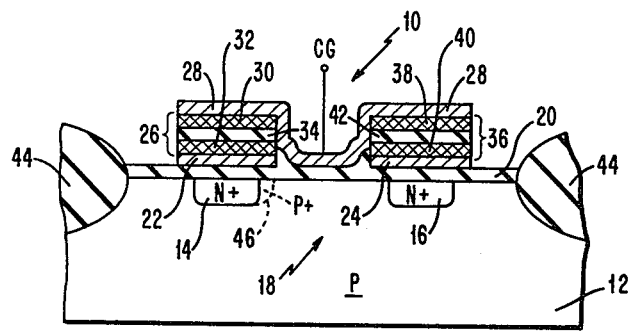
FIG. 1 is a sectional view illustrating an embodiment of a pair of memory cells of the present invention having a field effect transistor with two floating gates and a control gate.

Referring to FIG. 1 of the drawings in more detail, there is shown an embodiment of the invention which includes a field effect transistor 10 formed in a semiconductor substrate 12 preferably made of P-type material. The transistor includes first and second N+ regions 14 and 16 defining a channel region 18 therebetween disposed at the surface of the substrate 12. A thin dielectric layer 20 which may be made of silicon dioxide is formed on the surface of substrate 12 and first and second conductive plates acting as floating gates 22 and 24 are disposed on dielectric layer 20. Disposed on the floating gate 22 is a first dual charge or electron injector system 26 of the type disclosed in the above identified U.S. patent applications filed by H. N. Kotecha and H. N. Kotecha et al. The charge injector system 26 separates a common control gate 28, connected to a terminal CG, from the floating gate 22 and forms a capacitor with the floating gate 22 and the control gate 28 having a relatively small capacitance value. The dual charge injector system 26 includes preferably first and second silicon-rich layers of silicon dioxide 30 and 32, respectively, between which is disposed a dielectric layer 34, made preferably of silicon dioxide, as described more fully in the above identified H. N. Kotecha and H. N. Kotecha et al applications and the references cited therein. Disposed on the floating gate 24 is a second dual charge or electron injector system 36 similar to that of the first dual charge injector system 26. The second charge injector system 36 separates the common control gate 28 from the second floating gate 24 and forms a capacitor with the floating gate 24 and the control gate 28 having a relatively small capacitance value. The second dual charge injector system 36 includes preferably first and second silicon-rich layers of silicon dioxide 38 and 40, respectively, between which is disposed a dielectric layer 42, made preferably of silicon dioxide. The transistor 10 is isolated from other circuits which may be formed in substrate 12 by recessed or thick oxide regions identified by reference numeral 44.

In the operation of the cells of FIG. 1 of the drawings, a negative charge is stored on the first floating gate 22 or the second floating gate 24 to represent a 1 digit of binary information and the floating gate 22 or 24 without charge, or in an erase condition, represents a 0 digit of binary information. To store a negative charge or electrons on, e.g., the first floating gate 22, a voltage +V is applied to the first diffusion region 14 with the control gate grounded. Charge in the form of electrons is injected onto the floating gate 22 from the injector system 26, more specifically from silicon rich silicon dioxide layer 30. With the voltage +V having a value between, say, +10 volts and +20 volts, the charge will not tunnel into dielectric layer 20 toward the first diffusion region 14, since layer 20 is made to form a capacitor with the first diffusion region 14 and the first floating gate 22 having a capacitance larger than the capacitance between the first floating gate 22 and the control gate 28. Thus, all of the charge will remain on the floating gate 22. Furthermore, since the capacitance of the capacitor formed by the first diffusion region 14, dielectric layer 20 and the floating gate 22 is large compared with the capacitance of the dual injector system 26, most of the positive voltage applied to the diffusion region 14 is developed across the dual injector system 26 to drive a large quantity of charge rapidly onto the floating gate 22.

With the first floating gate 22 charged negatively the end of the channel 18 adjacent the first diffusion region 14 and under the gate 22 will accumulate an excess of positive charges to produce a field induced P+ like region 46 in the substrate 12. This P+ region 46 produces a high threshold voltage in transistor 10 which prevents current from passing through the channel 18 when a word pulse, e.g., of +5 to +10 volts, is applied to the control gate 28 and a drive voltage is applied to the second or drain diffusion region 16. The presence of the P+ region 46 producing a high voltage threshold represents the storing of, e.g., a 1 bit of binary information in the transistor 10. If the second floating gate is not charged negatively, but remains neutral, a low threshold voltage remains at the other end of the channel 18 near the second diffusion region 16. To determine that this end of the channel 18 has a low threshold voltage and, thus, storing a 0 bit of binary information, the word pulse is again applied to the control gate 28 and applied to the first diffusion region 14 is a drive voltage having a polarity and magnitude, e.g., +5 to +10 volts, sufficient to neutralize or deplete through the P+ region 46. Accordingly, it can be seen that either or both of the first and second floating gates 22 and 24 can be charged to store a 1 bit of binary information in the channel 18 at either or both ends thereof.

In order to remove the charge from the floating gates 22 or 24, a voltage +V is applied to the control gate 28 with the associated diffusion region 14 or 16 grounded. Again most of the positive voltage applied to the control gate 28 is developed across the dual injector system 26 or 36 and, because of the reversal in voltage polarity across injector system 26, the charge on the floating gate 22 or 24 is now attracted into the dual injector system 26 or 36 to erase the charge previously stored on the floating gate.

It can be seen that with the charge, i.e., electrons, trapped on the floating gate 22, the left side of transistor 10 exhibits a high threshold voltage and with no electrons trapped on the floating gate 22, the left side of transistor 10 has a substantially lower threshold voltage. Thus, by applying an appropriate voltage to the control gate 28 and the diffusion region 16, no current will pass through the channel region 18 between the source and drain regions 14 and 16, respectively, when electrons are trapped on the floating gate 22, representing a one digit of binary information, whereas with this same appropriate voltage applied to the control gate 28 and the diffusion region 16, current will pass through the channel region 18 when electrons are not trapped on the floating gate 22, representing the other digit of binary information. It should be noted that by using the charge injectors 26 and 36, only a low voltage, e.g., about 10 volts, need be used to store charge on a conductive plate or floating gate and that by using two dual injector systems disposed between the control electrode and the two floating gates, the same low voltage can be used for both charging and erasing either floating gate. This cell operates rapidly to both charge and discharge the floating gate since with approximately 10 volts applied across the dual injector a switching action occurs within the dual injector system readily injecting charge, within hundreds of nanoseconds, to or from the floating gate depending upon the voltage polarity across the dual injector system, and the information in the cell is read in a substantially shorter time. Thus, it can be seen that this cell can be used in an electrically alterable read only memory, or, if desired as a static non-volatile random access memory.

It should also be noted that if only a blanket erase is required in an array of these cells, a single injector rather than a dual injector need be disposed between the control gate 28 and the first and second floating gate 22 and 24. This single injector would include only the silicon-rich silicon dioxide or graded band gap layers 30 and 38 and the silicon dioxide layers 34 and 42. The writing or charging of the floating gates 22 and 24 would be performed as described hereinabove, but the blanket erase could be performed by the known use of ultraviolet radiation on the cells.

Figure 2:
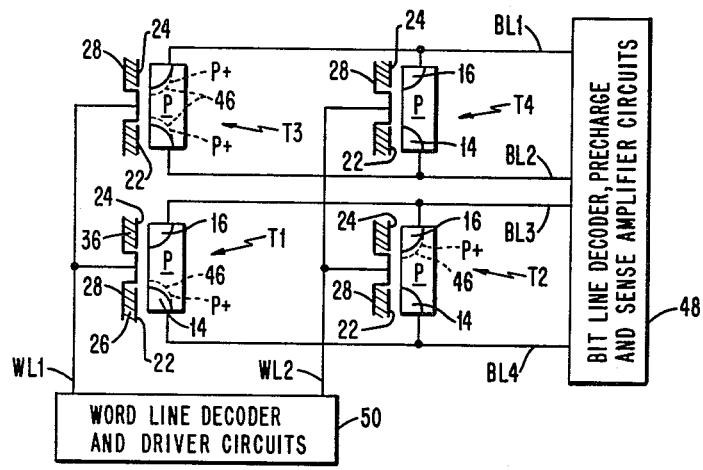
FIG. 2 illustrates a memory system of the present invention having an array of cells each of which may be of the type illustrated in FIG. 1 of the drawings.

In FIG. 2 of the drawing there is illustrated a memory system having an array of cells each of which may be of the type shown in FIG. 1 of the drawings. The array is shown as having four cells or transistors T1, T2, T3 and T4, each of which is similar to transistor 10 illustrated in FIG. 1 of the drawings, with similar elements being identified by the same reference numerals. Transistors T1 and T2 are arranged in a row and have their source/drain regions 14, 16 connected to bit lines BL3 BL4 and transistors T3 and T4 are arranged in a row with their source/drain regions connected to the bit lines BL1 and BL2. Bit lines BL1, BL2, BL3 and BL4 are connected to bit line decoder, precharge and sense amplifier circuits 48. Transistors T1 and T3 are arranged in a column and have their common control gate 28 connected to a first word line WL1 and the transistors T2 and T4, also arranged in a column, have their common control gate 28 connected to a second word line WL2. The control gates and the associated word line can be a single continuous element, if desired. The word lines WL1 and WL2 are connected to word line decoder and driver circuits 50.

Figure 3:
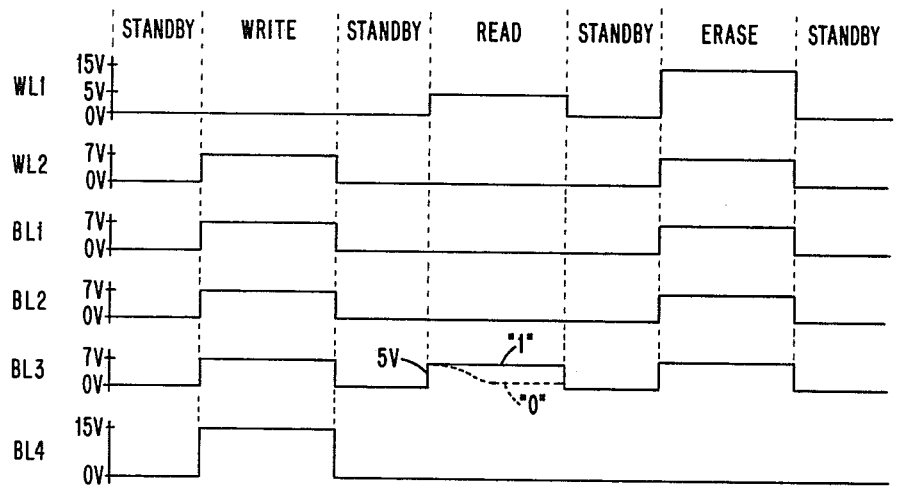
FIG. 3 is a pulse program which may be used to operate the system illustrated in FIG. 1 of the drawings.

To better understand the operation of the memory system illustrated in FIG. 2 of the drawing reference may be had to the pulse program indicated in FIG. 3. To write a 1 binary digit of information into the first floating gate 22 of transistor T1, as indicated in FIG. 3 of the drawing, a voltage of 0 volts is applied to word line WL1 and a voltage of +15 volts is applied to the first bit line BL4, with word line WL2 and the bit lines BL1, BL2, and BL3 at +7 volts. With this arrangement it can be seen that 0 volts are applied to the common control gate 28 of transistor T1 while the first N+ diffusion region 14 of transistor T1 is at +15 volts, causing electrons to be injected through the injector system 26 onto floating gate 22 resulting in a high threshold voltage formed by the P+ region 46. It should be noted that although 15 volts are applied also to the bit line BL4 of transistor T2, electrons will not be injected into the floating gate 22 of the transistor T2 since a voltage of +7 volts is applied to the second word line WL2 making a differential voltage between the common control gate 28 and the second diffusion region 14 of transistor T2 equal to only +8 volts. In case of transistors T3 and T4, again no electrons will be injected to the floating gates since sufficient voltage differential across the injector systems is not present. If a 0 digit of binary information were to be written into the first floating gate 22 of transistor T1, word line WL1 as well as bit line BL4 would be at +7 volts along with bit lines BL1, BL2, BL3 and word line WL2.

To read the 1 digit of binary information stored in floating gate 22 of the transistor T1, bit line BL3 is precharged to +5 volts and then a voltage of 5 volts is applied to the first word line WL1. Since the first floating gate 22 is charged with electrons producing a high threshold voltage in common transistor T1, the 5 volts applied to the common control gate 28 will not permit conduction through the channel region 18 between the source/drain 14, 16 of transistor T1 and, therefore, the voltage on bit line BL3 will remain at approximately 5 volts. If a 0 digit of binary information had been stored in cell T1, the 5 volts applied to the common control gate 28 of transistor T1 would permit conduction through the channel region 18 between the source/drain 14, 16 of transistor T1 and, therefore, the precharged bit line BL3 would be discharged to ground as indicated in FIG. 3 of the drawings. It should be noted that by also precharging bit line BL1 and grounding bit line BL2 the first floating gates of both transistors T3 and T1 may be read out simultaneously.

To erase or discharge the electrons stored in the floating gate 22 of transistor T1 representing a 1 digit of binary information, a voltage of 0 volts is applied to the first diffusion region 14 or bit line BL4 with the word line WL1 at +15 volts, while the second word line WL2 and the bit lines BL1, BL2 and BL3 are at +7 volts. It can be readily seen that with +15 volts on the common control gate 28 and bit line BL4 grounded, charge on the floating gate 22 of transistor T1 is attracted into the dual injector system 26 neutralizing the charge on floating gate 22. It should be noted that a negative voltage on the floating gate increases the field across the injector system to permit the removal of electrons. It can also be seen that even though 15 volts is applied to the common control gate 28 of transistor T3, transistor T3 will not be erased since a voltage of +7 volts is applied to the bit lines BL1 and BL2 of transistor T3 producing only a voltage differential of 8 volts between the common control gate 28 and the bit lines BL1 and BL2. Of course, if a 0 digit of binary information had been stored in the floating gate 22 of transistor T1, electrons would not be removed from the floating gate 22 since the applied voltage is not aided by charge on the floating gate due to the floating gate being in a neutral state. It will be noted that the erase pulse is not necessary for data values of 0 binary digits. The data can be read out to determine where an erase pulse is necessary. If all cells or transistors are to be erased simultaneously in a blanket erase, then all word lines WL1 and WL2 would be at +15 volts, with all other lines grounded. It should be noted that if a single injector, rather than a dual injector, is to be used between the common control gate 28 and the floating gates 22 and 24 erasing may be performed by the use of ultraviolet light. It should be noted that the cycle for writing, reading and erasing the information stored in the floating gates 22 and 24 of transistors T2, T3 and T4 is similar to that disclosed hereinabove in connection with the operation of cell T1.

Figure 4:
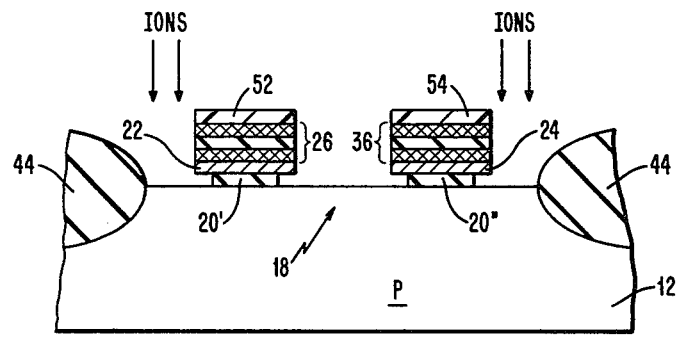
FIG. 4 is a sectional view of the embodiment of two of the cells of the present invention illustrated in FIG. 1 of the drawings during an early stage in the fabrication thereof.
Figure 5:
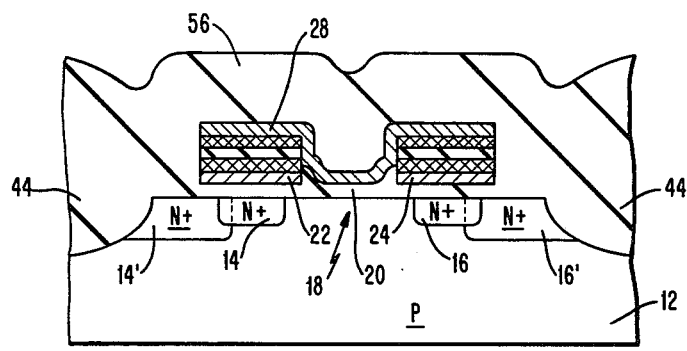
FIG. 5 is a sectional view of the embodiment of two of the cells of the present invention illustrated in FIG. 1 of the drawings during a later stage in the fabrication thereof than that illustrated in FIG. 4 of the drawings.

Although any known method may be used to fabricate the memory cells illustrated in FIGS. 1 and 2 of the drawings, one such method is described in connection with the sectional views shown in FIGS. 4 and 5, where FIG. 4 is a sectional view taken during an early stage in the fabrication thereof and FIG. 5 is a sectional view taken during a later stage. Elements shown in FIGS. 4 and 5 which are similar to the elements illustrated in FIGS. 1 and 2 are identified by the same reference numbers.

As indicated in FIG. 4 of the drawings, recessed or thick oxide regions 44 are formed in the semiconductor substrate 12 for isolation purposes and a thin layer of doped silicon dioxide is disposed over the structure followed by a first layer of doped polysilicon, a first layer of silicon-rich silicon dioxide, a layer of conventional silicon dioxide, a second layer of silicon-rich silicon dioxide and a layer of silicon nitride. These layers are then etched to form doped silicon dioxide segments 20' and 20", the floating gates 22 and 24, the dual charge injector systems 26 and 36 and segments of silicon nitride 52 and 54. It should be noted that the doped silicon dioxide segments 20' and 20" are undercut with respect to the floating gates 22 and 24 so as to permit the floating gates 22 and 24 to extend beyond the edges of the doped oxide segments 20' and 20" for the purpose of replicating the P+ effect within the channel region 18.

Next, the edges of the polysilicon floating gates 22 and 24 are oxidized and a layer of thin gate oxide formed over the exposed surfaces of the substrate 12. The silicon nitride segments 52 and 54 are removed by a known dip etch process and then a second layer of doped polysilicon is deposited over the structure and etched to form the common control gate 28, indicated in FIG. 5 of the drawings. Ion implantation techniques are then employed, using, e.g., arsenic or phosphorous ions, introducing the ions between the exposed edges of injector systems 26 and 36 and each of the two adjacent recessed oxide regions 44 for forming the source drain regions 14' and 16'. By using a known drive-in process, the dopant from the doped oxide segments 20' and 22'', which is also preferably arsenic, is out-diffused into the surface of the substrate 12 to form the first and second diffusion regions 14 and 16, while at the same time the implanted ions in the source/drain regions 14' and 16' are driven further into the substrate so as to merge into the first and second diffusion regions 14 and 16, as indicated in FIG. 5 of the drawings. Suitable contacts, not shown, may be made to the source/drain regions 14' and 16' by the bit lines. Any appropriate passivation layer 56 is then deposited on the structure to protect the elements therein.

Accordingly, it can be seen that the invention provides a programmable transistor simultaneously storing two bits of information which not only has the advantages of dual charge injector systems, such as speed and low voltage, but also provides an array with a high density of storage cells while employing simple and known fabrication techniques.

It should be understood that the injector systems 26 and 36 can be replaced, if desired, by a simple dielectric material which provides a capacitance having a value substantially smaller than the capacitance produced by the thin dielectric layer 20, but higher operating voltages would be required and speed is sacrificed.

Although a P-type substrate has been indicated in the illustrated embodiment, it should be understood that an N-type substrate may also be used, if desired, but with the polarities of the applied voltages reversed.

While the invention has been particularly shown and described with reference to preferred embodiments thereof, it will be understood by those skilled in the art that various changes in form and details may be made therein without departing from the spirit and scope of the invention.

What is claimed is:

1. A storage system comprising;
   a field effect transistor having first and second spaced apart diffusion regions defining a channel region having first and second ends and a control gate disposed over said channel region and extending from said first diffusion region to said second diffusion region,
   first and second charge trapping regions disposed over the first and second ends, respectively, of said channel region and between said control gate and said first and second diffusion regions,
   means for applying control pulses to said control gate and to said first and second diffusion regions for selectively controlling charge on said first and second charge trapping regions, and
   means for sensing current flow between said first and second diffusion regions.

2. A storage system as set forth in claim 1 further including a first charge injector system disposed between said first charge trapping region and said control gate and a second charge injector system disposed between said second charge trapping region and said control gate.

3. A storage system as set forth in claim 2 wherein said first and second charge trapping regions are floating gates.

4. A storage system as set forth in claim 2 wherein each of said first and second charge injector systems is a single charge injector system.

5. A storage system as set forth in claim 2 wherein each of said first and second charge injector systems is a dual charge injector system.

6. A storage system as set forth in claim 5 wherein each of said first and second charge trapping regions is a floating gate.

7. A storage system as set forth in claim 6 wherein each of said first and second charge injector systems includes first and second silicon-rich silicon dioxide layers and a dielectric film interposed between said first and second layers.

8. A storage system as set forth in claim 7 wherein said first and second floating gates and said control gate are made of doped polysilicon.

9. A storage system as set forth in claim 1 wherein said first and second charge trapping regions are first and second floating gates, respectively, and further including a first dielectric layer disposed between said first floating gate and said control gate, a second dielectric layer disposed between said second floating gate and said control gate, a third dielectric layer disposed between said first floating gate and said first diffusion region and a fourth dielectric layer disposed between said second floating gate and said second diffusion region and wherein said first floating gate, said first dielectric layer and said control gate form a first capacitor and said first floating gate, said third dielectric layer and said first diffusion region form a second capacitor having a capacitance substantially larger than the capacitance of said first capacitor, said second floating gate, said second dielectric layer and said control gate form a third capacitor and said second floating gate, said fourth dielectric layer and said second diffusion region form a fourth capacitor having a capacitance substantially larger than the capacitance of said third capacitor.

10. A storage system as set forth in claim 9 wherein said control pulse applying means applies pulses to said control gate and to said first and second diffusion regions.

11. A storage system as set forth in claim 10 wherein said control pulse applying means applies a voltage pulse of a given magnitude to said first diffusion region and simultaneously applies a voltage pulse of a substantially different magnitude from that of said given magnitude to said second diffusion region.

12. A multi-storage system comprising;
    a field effect transistor having a channel region formed between first and second spaced apart diffusions, a control gate and first and second floating gates disposed over said first and second diffusions, respectively, and extending over said channel region,
    means for selectively controlling charge on said first floating gate and for independently controlling charge on said second floating gate, and
    means for sensing current flow between said first and second diffusions.

13. A storage system as set forth in claim 12 further including first and second graded band gap layers disposed between said first and second floating gates and said control gate.

14. An electrically alterable read only memory comprising;
    an array of first, second, third and fourth field effect transistors, each transistor having first and second spaced apart diffusion regions defining a channel region, a control gate disposed over said channel region and extending from said first diffusion region to said second diffusion region, and first and second floating gates disposed over said first and second diffusion regions between said control gate and said first and second regions and extending over said channel region,
    first and second word lines, said first word line being connected to the control gate of said first and second transistors, and said second word line being connected to the control gate of said third and fourth transistors,
    first, second, third and fourth bit lines, said first and second bit lines being connected to the first and second diffusion regions, respectively, of said first and third transistors and said third and fourth bit lines being connected to the first and second diffusion regions, respectively, of said second and fourth transistors,
    means for applying control pulses to said control gates and to said diffusion regions for selectively controlling charge on said first and second floating gates, and
    means for sensing current flow between said first and second diffusion regions.

15. An electrically alterable read only memory as set forth in claim 14 wherein each of said transistors further includes a first conduction enhanced insulator disposed between said first floating gate and said control gate and a second conduction enhanced insulator disposed between said second floating gate and said control gate and wherein the capacitance between said first floating gate and said first diffusion region is substantially larger than the capacitance between said first floating gate and said control gate and the capacitance between said second floating gate and said second diffusion region is substantially larger than the capacitance between said second floating gate and said control gate.

* * * * *